United States Patent
Hirai et al.

(10) Patent No.: US 8,003,435 B2
(45) Date of Patent: Aug. 23, 2011

(54) METHOD OF MANUFACTURING ORGANIC FILM TRANSISTOR

(75) Inventors: Katsura Hirai, Hachioji (JP); Atsuko Matsuda, Hachioji (JP); Tatsuo Tanaka, Sagamihara (JP); Chiyoko Takemura, Tokyo (JP); Rie Katakura, Hino (JP); Reiko Obuchi, Yokohama (JP)

(73) Assignee: Konica Minolta Holdings, Inc., Chiyoda-Ku, Tokyo (JP)

( * ) Notice: Subject to any disclaimer, the term of this patent is extended or adjusted under 35 U.S.C. 154(b) by 1106 days.

(21) Appl. No.: 11/721,523

(22) PCT Filed: Dec. 13, 2005

(86) PCT No.: PCT/JP2005/022809
§ 371 (c)(1),
(2), (4) Date: Jun. 12, 2007

(87) PCT Pub. No.: WO2006/064776
PCT Pub. Date: Jun. 22, 2006

(65) Prior Publication Data
US 2010/0178727 A1 Jul. 15, 2010

(30) Foreign Application Priority Data
Dec. 17, 2004 (JP) .................. 2004-365756

(51) Int. Cl.
*H01L 51/00* (2006.01)
(52) U.S. Cl. .................... 438/99; 257/40; 257/E51.003; 257/E51.027
(58) Field of Classification Search .............. 438/99, 438/149, 150, 151, 166; 257/40, E51.001, 257/E51.003, E51.027, E51.028
See application file for complete search history.

(56) References Cited

U.S. PATENT DOCUMENTS

| | | | | |
|---|---|---|---|---|
| 6,583,583 B1 * | 6/2003 | Soeda et al. | ............... | 315/169.3 |
| 2004/0056255 A1 * | 3/2004 | Robeson et al. | ................ | 257/79 |
| 2006/0033086 A1 * | 2/2006 | Gerlach | ........................ | 252/500 |
| 2006/0076554 A1 * | 4/2006 | Maeda et al. | ................... | 257/40 |
| 2006/0145148 A1 * | 7/2006 | Hirai et al. | ...................... | 257/40 |
| 2007/0078267 A1 * | 4/2007 | Dotz et al. | ...................... | 549/59 |

FOREIGN PATENT DOCUMENTS

| | | |
|---|---|---|
| JP | 179249 | 6/2004 |
| JP | 234931 | 8/2004 |

OTHER PUBLICATIONS

ChemicalBook, 2007, alpha-quarterthiophene at http://www.chemicalbook.com/ChemicalProductProperty_EN_CB3463576.htm.*
Colle et al., "Thermal, structural and photophysical properties of the organic semiconductor Alq3", Phys. Stat. Sol., 2004: pp. 1095-1115.*

* cited by examiner

*Primary Examiner* — Matthew Smith
*Assistant Examiner* — Michele Fan
(74) *Attorney, Agent, or Firm* — Lucas & Mercanti, LLP

(57) ABSTRACT

A method of fabricating an organic thin film transistor exhibiting excellent semiconductor performance by which an organic TFT can be formed continuously on a flexible base such as a polymer support through a simple coating process, and thus the fabrication cost can be reduced sharply, and an organic semiconductor layer thus formed has a high carrier mobility, In the method of fabricating an organic thin film transistor by forming a gate electrode, a gate insulation layer, an organic semiconductor layer, a source electrode and a drain electrode sequentially on a support, the organic semiconductor layer contains an organic semiconductor material having an exothermic point and an endothermic point in a differential scanning thermal analysis, and the organic semiconductor layer thus formed is heat-treated at a temperature not less than the exothermic point and less than the endothermic point.

5 Claims, 2 Drawing Sheets

METHOD OF MANUFACTURING ORGANIC FILM TRANSISTOR

FIELD OF THE INVENTION

The present invention relates to a method of manufacturing an organic film transistor and more specifically to a method of manufacturing an organic film transistor manufactured using a soluble organic semiconductor material.

BACKGROUND OF THE INVENTION

In recent years, various organic film transistors using an organic semiconductor have been proposed. The research and development are in progress for an organic film transistor (TFT) as a device for a display and an electronic tag which can be manufactured by a simple process such as printing using a plastic supporter.

Specifically, an art for a transistor manufactured using a soluble organic semiconductor material as an organic film transistor, for example, for an all-polymer type organic TFT is disclosed, for example, in Patent Document 1 (WO 01/47043 Pamphlet) and Patent Document 2 (Japanese Patent Application Publication No. 2000-307172, hereafter referred to as JP-A No.).

According to these documents, a transistor can be manufactured by a simple process of ink jet and coating using a soluble organic semiconductor material. However, with respect to the transistor manufactured by the above method, there is an advantage that it can be manufactured at a low cost, while the resistivity of the conductive polymer itself is high and the carrier mobility of the TFT is not sufficient, so that there are problems imposed in the organic TFT obtained that the gate voltage is high, and the current in the switch-on state is low, and the current on or off value is low.

Patent Document 1: International Publication 01/47043 Brochure

Patent Document 2: Japanese Patent Application 2000-307172

SUMMARY OF THE INVENTION

The present invention has been made in the foregoing circumstances. An object of the present invention is to provide a method of manufacturing an organic film transistor by which an organic film transistor having a high carrier mobility in the formed organic semiconductor layer and an excellent semiconductor performance can be obtained by continuously forming an organic TFT on a flexible base such as a polymer supporter in a simple process of a coating method, whereby the manufacturing cost is greatly reduced.

The above object of the present invention is achieved by the following Structures.

(Structure 1) A method of producing an organic thin film transistor comprising sequential steps of forming the following elements on a substrate:
  forming a gate electrode;
  forming a gate insulating layer;
  forming an organic semiconductor layer;
  forming a source electrode; and
  forming a drain electrode,
wherein
  the organic semiconductor layer comprises an organic semiconductor material exhibiting an exothermic point and an endothermic point in differential scanning calorimetry; and
  the organic semiconductor layer is subjected to a heat treatment carried out at a temperature not less than the exothermal point and less than the endothermal point, after the organic semiconductor layer is formed.

(Structure 2) The method of Structure 1, wherein the organic semiconductor layer is formed by using a solution or a dispersion liquid comprising an organic semiconductor material.

(Structure 3) The method of Structure 1 or 2, wherein the organic semiconductor material is a π conjugated compound.

(Structure 4) The method of any one of Structures 1 to 3, wherein a weight average molecular weight of the organic semiconductor material is 5000 or less.

(Structure 5) The method of any one of Structures 1 to 4, wherein the organic semiconductor layer is subjected to a heat treatment after the drain electrode is formed.

DESCRIPTION OF THE PREFERRED EMBODIMENTS

Figure 1:
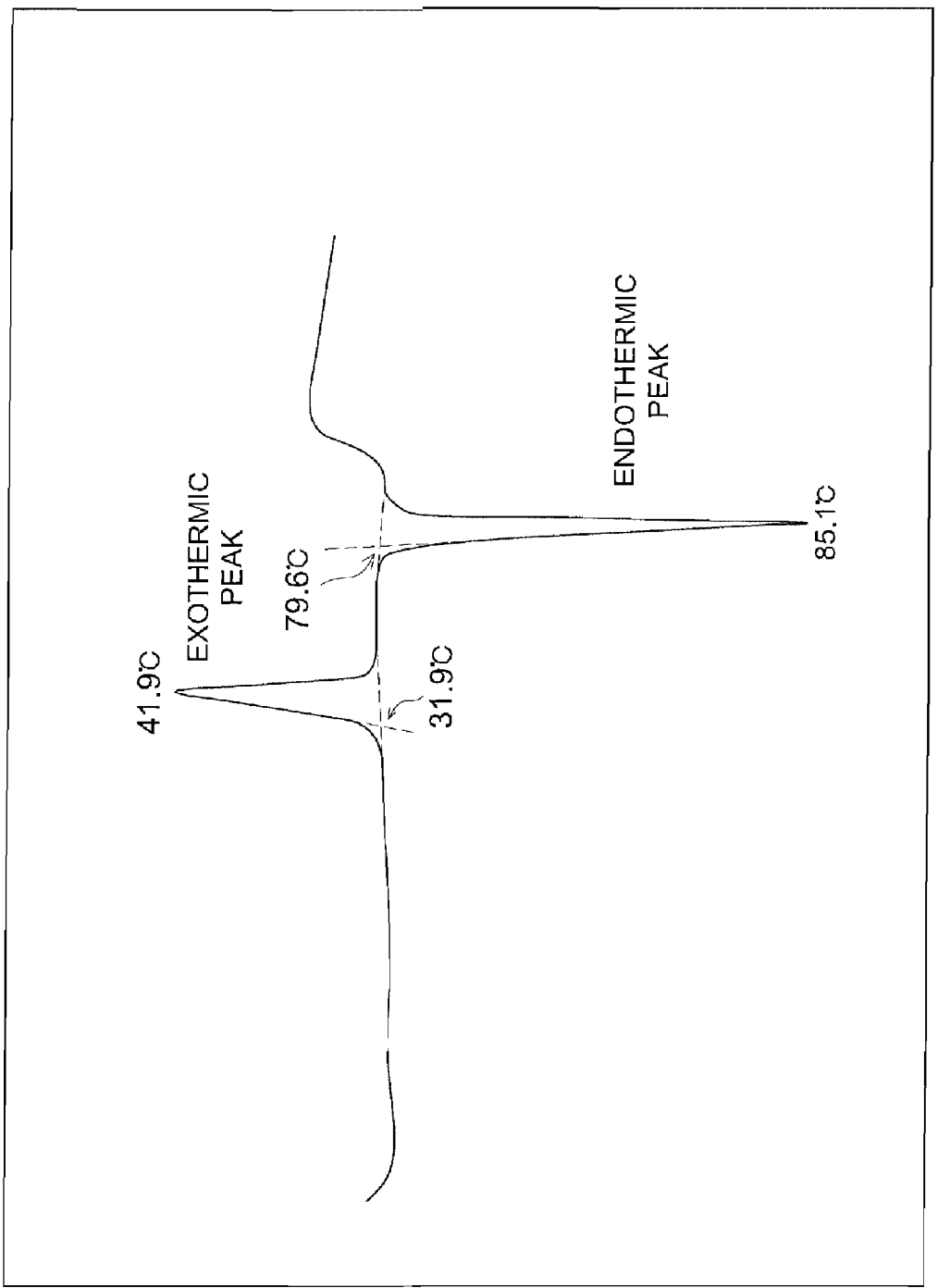
FIG. 1 is a diagram showing an example of a differential scanning thermal analysis (DSC).

Next, the preferred embodiments for executing the present invention will be explained, however, the present invention is not limited thereto.

According to the present invention, by use of the manufacturing method of an organic film transistor specified by any one of the structures 1 to 5, a durable organic film transistor (TFT) having excellent transistor properties such as a high carrier mobility and a satisfactory ON/OFF property can be obtained. A switching element prepared using an organic film transistor or a field effect transistor prepared by the present invention shows a satisfactory switching property.

It has been reported that as an organic semiconductor material, for example, pentacene, specifically, for example, pentacene formed by vacuum evaporation shows a satisfactory TFT property. In an organic film transistor specifically using vacuum evaporated pentacene as an organic semiconductor layer, it is known that in the organic semiconductor layer, molecules are arranged regularly by forming π stacks between themselves. However, in polythiophene such as PHT, since it is a polymer, the organic semiconductor layer (film) is formed by application of a solution dissolving it (that is, by coating), so that an inter-molecule regular arrangement is formed only partially. Namely, specifically when using polythiophene described in Patent Documents 1 and 2, it is inferred that since it is composed of large polymer molecules, π stacks are formed just more partially, and there exist many parts not relating to π stacks as disordered orientation areas, and sufficient carrier mobility and ON/OFF property tend not be obtained.

In a semiconductor material film, as the crystalline region is increased and as the ratio of the crystalline region is increased, the carrier mobility is improved. Therefore, when the molecular weight of a polymer is increased, it is general that the random region is increased and the property is lowered.

The inventors have examined the above problems and found that in JP-A No. 2004-172317 applied on Jun. 10, 2004, the thiophene oligomers having a soluble site (the thiophene ring site having a substituent group) and a π stack forming site (the site where a non-substituent thiophene ring is continued) and having a molecular weight which is adjusted within a specific range (this is synonymous with adjustment of the number of repetitive units within a specific range), are molecularly-designed, and by use of the oligomers, the carrier mobility and ON/OFF property can be improved, and the performance of the organic semiconductor layer formed by coating can be improved. The reason seems to be that the regularity of the molecular arrangement due to the π stack forming site is increased.

However, the inventors have found that the property of the organic semiconductor film prepared just by dissolving the organic semiconductor material such as those thiophene oligomers in a solvent, followed by coating, are often varied and the expected performance cannot be obtained.

The inventors furthermore extensively examined these problems and found that by employing the manufacturing method of an organic film transistor described in above Structures 1 to 5, an organic film transistor not only free from the aforementioned variations but also having improved property can be obtained.

Hereinafter, the components relating to the present invention will be sequentially explained in detail.

According to Structure 1, the organic semiconductor material contained in the organic semiconductor layer has an exothermic point and an endothermic point in the differential scanning calorimetry (DSC) measurement and by use of the manufacturing method having a heat-treating step at a temperatures not lower than the aforementioned exothermic point of the organic semiconductor material and lower than the aforementioned endothermic point for the organic semiconductor layer, the aforementioned organic film transistor having an excellent property can be obtained.

The present invention is specifically effective in an organic film transistor having an organic semiconductor layer specifically formed by coating.

Generally, in the case of the aforementioned thiophene oligomers, for example, a semiconductor material is dissolved in a solvent for dissolving such as chloroform, and then is coated on a substrate, and is dried, thus an organic semiconductor layer is formed. Therefore, as mentioned above, it may be inferred that the mobility is increased by a somewhat regular molecular arrangement due to the π stack forming site, by which many of the thiophene oligomers show an exothermic peak and an endothermic peak in the differential scanning calorimetry (DSC).

An example of the thiophene oligomer, for example, the case of Compound Example <1> is shown in FIG. 1. In this example, the exothermic peak and endothermic peak are measured at a temperature rising speed of 10°/min. For the differential scanning calorimeter (DSC), DSC6220 produced by SSI Nano-Technology, Ltd. is used.

The measured values themselves may vary somewhat with the temperature rising condition. In the present invention, for example, as a standard condition, the values measured at the temperature rising speed of 10 degree/min as aforementioned are decided as an exothermic point and an endothermic point.

In FIG. 1, the exothermic peak corresponds to heat radiation of the semiconductor material, and for example, due to the molecules themselves or the interaction between the molecules, it may be considered that due to transfer to a more stable form, excessive energy is emitted, and generally, the exothermic peak may be considered to be a temperature at which crystallization, or change in the crystalline structure, or any structuration (an increase in the π stack) occurs.

Further, the endothermic peak is a temperature corresponding to a process that the structured arrangement collapses due to heat, for example, corresponding to fusion (the melting point) of the crystal and requires the heat of fusion.

Therefore, the improvement of the carrier mobility of the present invention may be considered, in the organic semiconductor layer, to be realized by an effect of heat-treating the organic semiconductor material at a temperature higher than the temperature at which structuration due to heat occurs, thereby increasing the structuration region of the organic semiconductor layer, and increasing the number of structuration regions.

In the DSC measurement, the exothermic point, from the linear portion of the base line at time of heating, is defined as the temperature (exothermic start temperature) corresponding to the intersecting point between the linear portion of the exothermic peak and the base line. In FIG. 1, 31.9° C. indicates the exothermic point. Therefore, when the leading edge is a curved line, it is the intersecting point between the tangent at the inflection point thereof and the base line.

Further, the endothermic point is also defined as the temperature (endothermic start temperature) corresponding to the intersecting point between the leading linear portion from the base line at time of heating and the base line. In FIG. 1, 85.1° C. indicates the endothermic point.

In the organic semiconductor material, a compound having the exothermic point (exothermic peak) and endothermic point (endothermic peak) by the differential scanning calorimetry is seen in a polymer, an oligomer, or a low-molecular weight compound and to such a compound having an exothermic point and an endothermic point, the present invention can be applied. For example, when a semiconductor film is obtained by dissolution and coating using a derivative such as aforementioned pentacene, it is a useful method. By this method, from the viewpoint of the structuration or crystallization of the organic semiconductor material, it may be considered to realize improvement of the size of the crystalline region contributing to improvement of the carrier mobility which cannot be realized by formation only by coating or increase in the number of crystalline regions, and these properties relating to the carrier mobility can be changed greatly, and a semiconductor film having a higher carrier mobility can be obtained.

The aforementioned heat treatment of the present invention may be considered to cause structuration such as crystallization of a substance and arrangement change and with respect to changes at a temperature higher than the exothermic point of the organic semiconductor material, the temperature and time vary with the kind of material thereof.

Generally, the structuration is arrangement change in a solid film, and in the differential scanning calorimetry (DSC) measurement, at a constant temperature higher than the aforementioned exothermic point and lower than the aforementioned endothermic point, the heat treatment from 10 seconds to one week is executed.

According to the present invention, the constant temperature, for example, is not controlled by cooling or heating but to promote positively the aforementioned structuration, the organic semiconductor material is kept at the temperature at which the aforementioned structuration occurs for a given period of time and the structuration is executed surely.

Therefore, the present invention is characterized in that the organic semiconductor layer containing the organic semiconductor material is heat-treated for a given period of time at a temperature higher than the aforementioned exothermic point of the organic semiconductor material and lower than the aforementioned endothermic point in the differential scanning calorimetry (DSC) measurement.

For example, in the case of the thiophene oligomers aforementioned, the exothermic point is at 31.9° C. and the endothermic point is at 79.6° C., and at a temperature within this range, execution of the heat treatment for a given period of time produces the effect of the present invention.

Further, as one of the variations of the present invention, prior to the heat treatment at a constant temperatures higher than the aforementioned exothermic point and lower than the aforementioned endothermic point in the differential scanning calorimetry (DSC) measurement, a method for executing once the heat treatment at a temperature higher than the aforementioned endothermic point may be cited. Namely, at the cooling process after execution of the heat treatment at a temperature higher than the aforementioned endothermic point, the aforementioned method for executing the treatment for a given period of time at a constant temperatures higher than the exothermic point and lower than the endothermic point may be used.

Probably, it may be considered that there is a case that to form a structure (amorphous) having a random molecular arrangement by setting once an organic semiconductor material at a temperature higher than the endothermic point, that is, the heat fusion temperature or the fusion temperature is preferable, when cooling it and executing again the heat treatment at a constant temperature higher than the exothermic point and lower than the endothermic point, for causing uniform structuration such as crystallization and arrangement change in the layer.

Needless to say, a method, in order to dissolve once the organic semiconductor material, form the solution by coating, and then make once the state uniform, for heating it higher than the endothermic point (fusion point), then cooling it again lower than the exothermic point, heating again, and maintaining the organic semiconductor material film for the given period of time within the temperature range higher than the exothermic point of the organic semiconductor material and lower than the endothermic point may be used.

These optimum conditions vary with a compound and in short, it is important to maintain the organic semiconductor material film at the crystallization (or crystalline structure change) temperature, that is, at a temperature higher than the exothermic point of the organic semiconductor material and lower than the endothermic point for a given period of time.

Further, according to the present invention, these heat treatments are preferably executed in inactive gas such as nitrogen gas, argon, or helium to suppress deterioration and decomposition of the organic semiconductor material and the pressure is optional, though pressure close to the atmospheric pressure, for example, the range from 70 to 130 kPa is preferable.

The organic semiconductor material is dissolved in a solvent, and the solution is coated on a substrate, thus the organic semiconductor layer relating to the present invention is formed, though the organic semiconductor material may not be always dissolved perfectly, and a liquid in a dispersed state may be formed, and in short, when forming a film after coating, a uniform film is desirably formed. When a film with a uniform thickness is formed, in the subsequent heat treatment, re-arrangement of molecules and fusion of the regions composed of crystallites are caused, and the structuration region of the organic semiconductor material is increased, and the number of structuration regions is increased, and an organic semiconductor layer having a large carrier mobility is obtained similarly.

The organic semiconductor material relating to the present invention is a π conjugated series compound and the π conjugated series compound is a compound in which there is a π conjugated series in each molecule, and molecules can be arranged regularly by forming π stacks between themselves.

Therefore, not only the aforementioned thiophene oligomer but also a polymer and a low-molecular weight compound are a compound having a π conjugated series in which molecules are arranged by forming π stacks between themselves and if any compound shows an exothermic point and an endothermic point by the differential scanning calorimetry aforementioned, the present invention can be applied to it.

As a low-molecular weight compound, typically, there is a compound such as pentacene, and specifically, for example, there are the pentacene group having a substituent group described in WO03/16599, WO03/28125, U.S. Pat. No. 6,690,029, and Japanese Patent Application 2004-107216 and the pentacene precursor group described in US2003-136964, which can be used in the present invention. The molecular weight is preferably 5000 or lower.

Further, as an organic semiconductor material with a lower-molecular weight than the aforementioned molecular weight, a compound containing two or more heterorings in the molecular structure is preferable and specifically, a compound in which the aforementioned heterorings are thiophene rings may be cited as a preferable compound. The concerned thiophene ring may have a substituent group such as the alkyl group or may be a non-substituent ring, though it contains preferably the thiophene ring having a substituent group in each molecule, and it contains more preferably both the thiophene ring having a substituent group and non-substituent thiophene ring. Furthermore, two or more thiophene rings are preferably connected and the number of connected thiophene rings is preferably 2 to 10.

Further, any polymer such as polyphenylenevinylene, polypyrrole, or polythiophene, if it has the aforementioned endothermic point and exothermic point, can be used in the present invention. Also in a polymer, the weight-average molecular weight is preferably 5000 or lower. Typically, the thiophene polymer described in JACS 2004, 126, 3378 may be cited.

Further, according to the present invention, an oligomer having a molecular weight lower than the average molecular weight 5000 is a preferable compound as an organic semiconductor material. As an oligomer preferably used specifically in the present invention, the thiophene oligomer may be cited.

As a thiophene oligomer preferably used in the present invention, it is preferable to include a thiophene oligomer having a partial structure in which at least two repeating units of the thiophene ring having a substituent group and repeating units of the non-substituent thiophene ring are respectively connected and set the number of thiophene rings included in the thiophene oligomer within the range from 8 to 20.

According to the present invention, the thiophene oligomer described in Japanese Patent Application 2004-172317 applied by the inventors on Jun. 10, 2004 is used preferably. A preferable thiophene oligomer has a partial structure expressed by following Formula (1).

Formula (1)

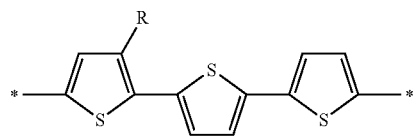

In the formula, a symbol R represents a substituent.

<<Thiophene Oligomer Represented by Formula (1)>>

The thiophene oligomer represented by Formula (1) used in the present invention will be described.

Examples of a substituent represented by R in Formula (1) include: an alkyl group (for example, a methyl group, an ethyl group, a propyl group, an isopropyl group, a tert-butyl group, a pentyl group, a hexyl group, an octyl group, a dodecyl group, a tridecyl group, a tetradecyl group and a pentadecyl group); a cycloalkyl group (for example, a cyclopentyl group and a cyclohexyl group); an alkenyl group (for example, a vinyl group and an allyl group); alkynyl groups (for example, an ethynyl group and a propargyl group); an aryl group (for example, a phenyl group, a p-chlorophenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group and a biphenylyl group); an aromatic heterocyclic group (for example, a furyl group, a thienyl group, a pyridyl group, a pyridazyl group, a pyrimidyl group, a pyrazyl group, a triazyl group, an imidazolyl group, a pyrazolyl group, a thiazolyl group, a benzimidazolyl group, a benzoxazolyl group, a quinazolyl group, and a phthalanyl group), a heterocyclyl group (for example, a pyrrolidyl group, an imidazolydyl group, a morpholyl group, and an oxazolydyl group), an alkoxy group for example, a methoxy group, an ethoxy group, a propyloxy group, a pentyloxy group, a hexyloxy group, an octyloxy group, and a dodecyloxy group), a cycloalkoxy group (for example, a cyclopentyloxy group and a cyclohexyloxy group), an aryloxy group (for example, a phenoxy group and a naphthyloxy group), an alkylthio group (for example, a methylthio group, an ethylthio group, a propylthio group, a pentylthio group, a hexylthio group, an octylthio group, and a dodecylthio group), a cycloalkylthio group (for example, a cyclopentylthio group and a cyclohexylthio group), an arylthio group (for example, a phenylthio group and a naphthylthio group), an alkoxycarbonyl group (for example, a methyloxycarbonyl group, an ethyloxycarbonyl group, a butyloxycarbonyl group, an octyloxycarbonyl group, and a dodecyloxycarbonyl group), an aryloxycarbonyl group (for example, a phenyloxycarbonyl group and a naphthyloxycarbonyl group), a sulfamoyl group (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, and a 2-pyridylaminosulfonyl group), an acyl group (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecycarbonyl group, a phenylcarbonyl group, a naphthylcarbonyl group, and a pyridylcarbonyl group), an acyloxy group (for example, an acetyloxy group, an ethylcarbonyloxy group, a butylcarbonyloxy group, an octylcarbonyloxy group, a dodecycarbonyloxy group, and a phenylcarbonyloxy group), an amido group (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group, and a naphthylcarbonylamino group), a carbamoyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, and a 2-pyridylaminocarbonyl group), a ureido group (for example, a methylureido group, an ethylureido group, a pentylureido group, a cyclohexylureido group, an octylureido group, a dodecylureido group, a phenylureido group, a naphthylureido group, and a 2-pyridylaminoureido group), a sulfinyl group (for example, a methylsulfonyl group, an ethylsulfonyl group, a butylsulfonyl group, a cyclohexylsulfinyl group, a 2-ethylhexylsulfinyl group, a dodecylsulfinyl group, a phenylsulfonyl group, a naphthylsulfinyl group, and a 2-pyridylsulfinyl group), an alkylsulfonyl group (for example, a methylsulfonyl group, an ethylsulfonyl group, a butylsulfonyl group, a cyclohexylsulfonyl group, a 2-ethylhexylsulfonyl group, and a dodecylsulfonyl group), an arylsulfonyl group (for example, a phenylsulfonyl group, a naphthylsulfonyl group, and a 2-pyridylsulfonyl group), an amino group (for example, an amino group, an ethylamino group, a dimethylamino group, a butylamino group, a cyclopentylamino group, a 2-ethylhexylamino group, a dodecylamino group, an anilino group, a naphthylamino group, and a 2-pyridylamino group), an halogen atom (for example, a fluorine atom, a chlorine atom, and a bromine atom), a fluorinated hydrocarbon group (for example, a fluoromethyl group, a trifluoromethyl group, a pentafluoroethyl group), a cyano group, a silyl group (for example, a trimethylsilyl group, a triisopropylsilyl group, a triphenylsilyl group, and a phenyldimethylsilyl group).

These substituents may further be substituted with the above substituents, and a plurality of the above substituents may join to form a ring.

Of these, the preferred substituent is an alkyl group, the more preferred one is an alkyl group having 2-20 carbon atoms, but the most preferred one is an alkyl group having 4-12 carbon atoms.

<<Terminal Group of Thiophene Oligomer>>

The terminal group of a thiophene oligomer employed in the present inventions will now be described.

It is preferable that the terminal group of the thiophene oligomers employed in the present invention has no thienyl group. Listed as preferred groups in the above terminal group are an aryl group (for example, a phenyl group, a p-chlorophenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group, and a biphenyl group), an alkyl group (for example, a methyl group, an ethyl group, a propyl group, an isopropyl group, a tert-butyl group, a pentyl group, a hexyl group, an octyl group, a dodecyl group, a tridecyl group, a tetradecyl group, and a pentadecyl group), a halogen atom (for example, a fluorine atom, a chlorine atom, and a bromine atom).

<<Characteristics of Steric Structure of Repeating Unit of Thiophene Oligomer>>

It is preferable that thiophene oligomers employed in the present invention have no head-to-head structure. In addition, it is more preferable that a head-to-tail structure or a tail-to-tail structure is incorporated.

With regard to the head-to-head structure, the head-to-tail structure and the tail-to-tail structure according to the present invention, reference can be made, for example, on pages 27-32 of "π Denshi Kei Yuki Kotai (π Electron Based Organic Solids" (edited by the Chemical Society of Japan, published by Gakkai Shuppan Center, 1998) and to Adv. Mater. 1998. 10, No. 2, pages 93-116. Each of the structural characteristics will now be specifically described.

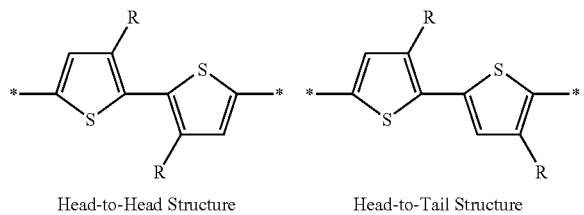
Head-to-Head Structure    Head-to-Tail Structure
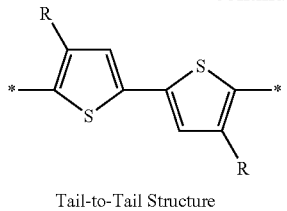
Tail-to-Tail Structure
Specific examples of the thiophene oligomers employed in the present invention are listed below; however, the present invention is not limited thereto.
(1)
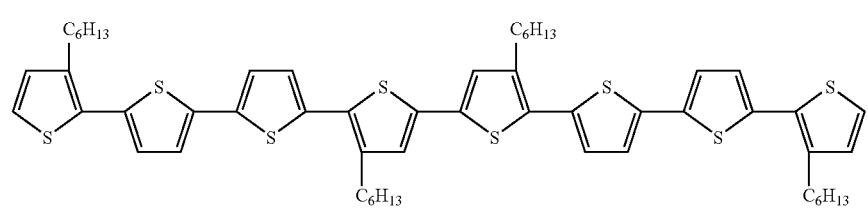
(2)
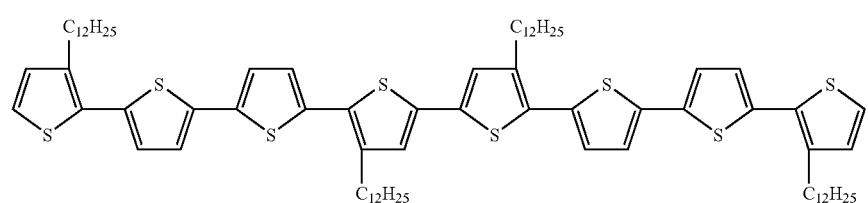
(3)
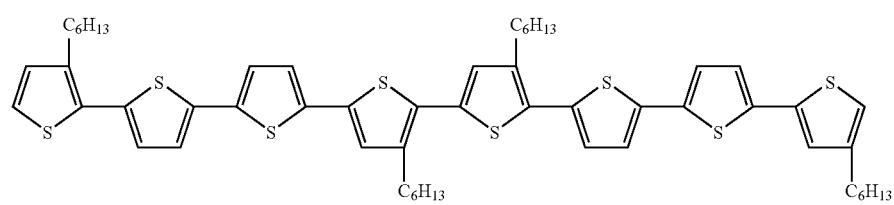
(4)
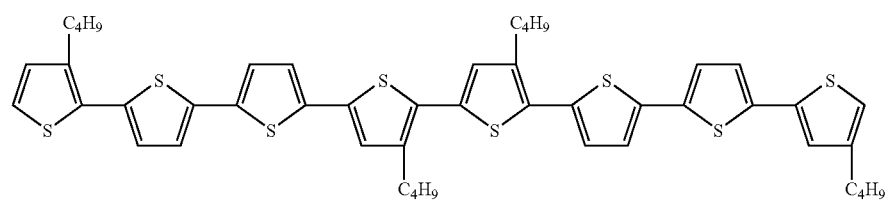
(5)
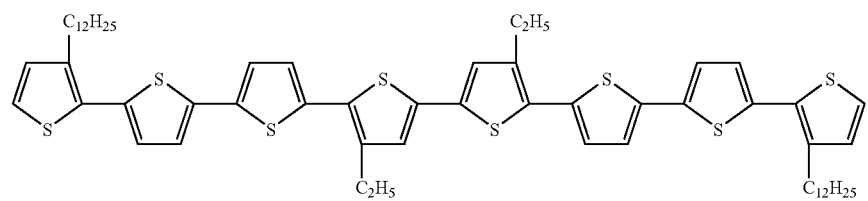
(6)
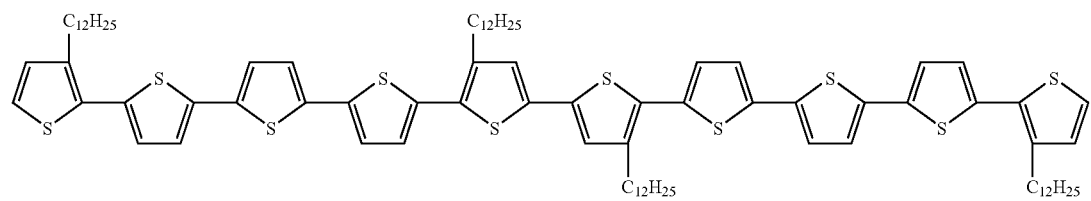

-continued
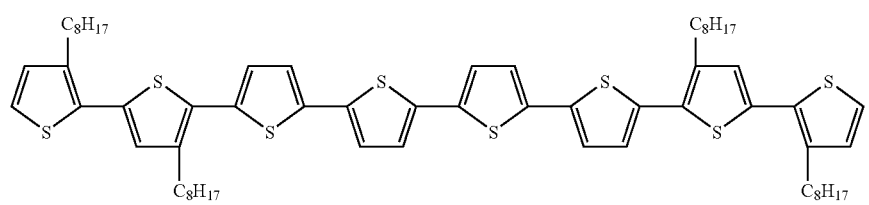
(7)
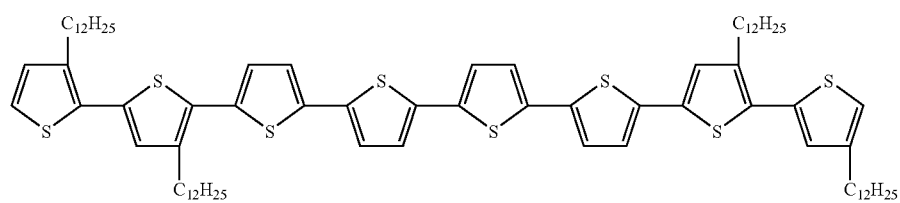
(8)
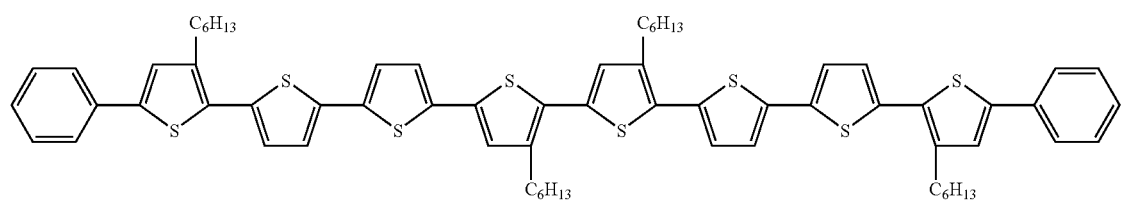
(9)
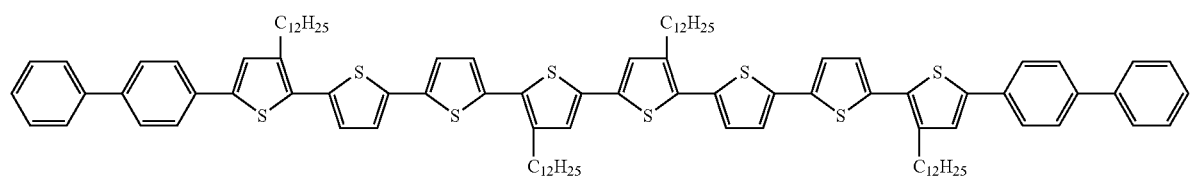
(10)
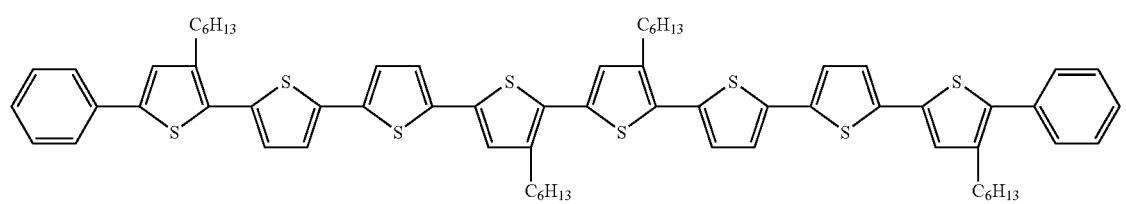
(11)
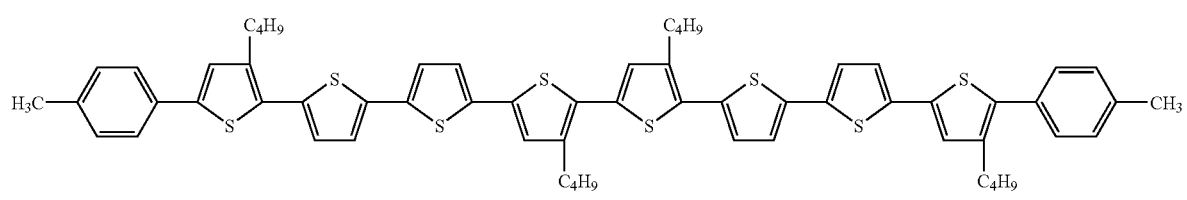
(12)
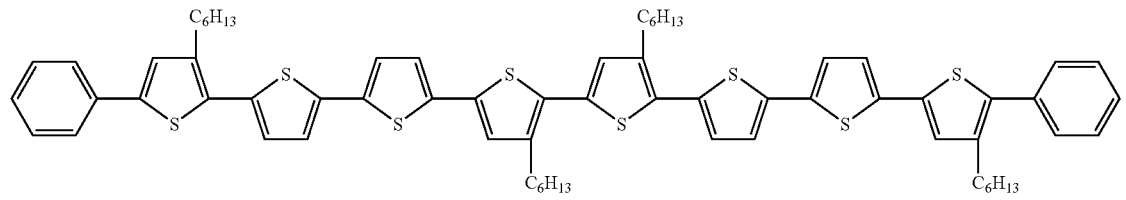
(13)
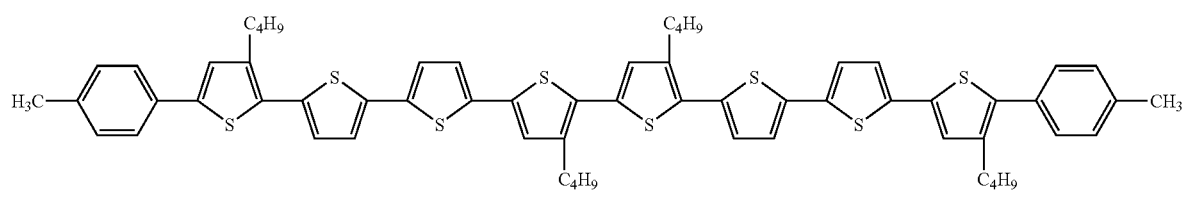
(14)

-continued
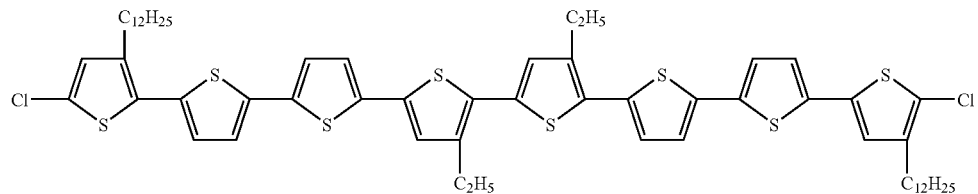
(15)
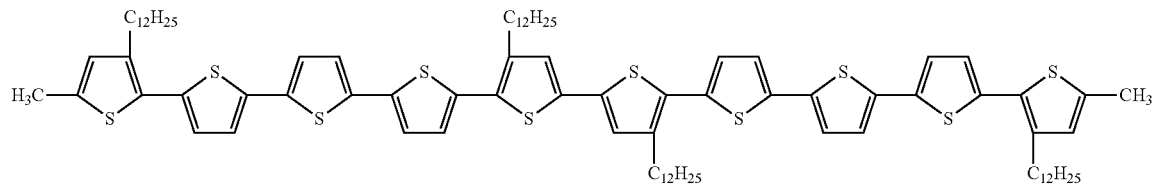
(16)
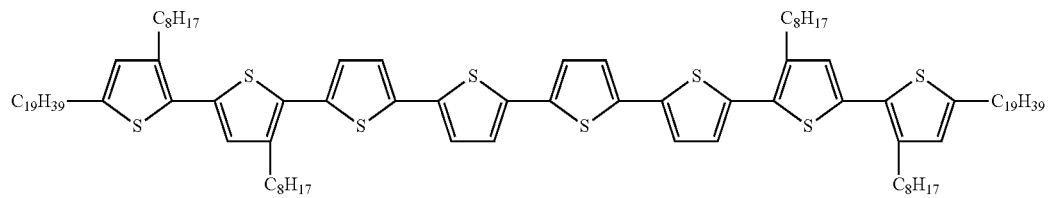
(17)
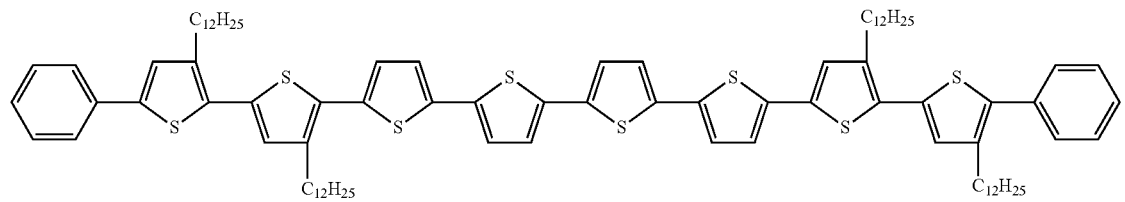
(18)
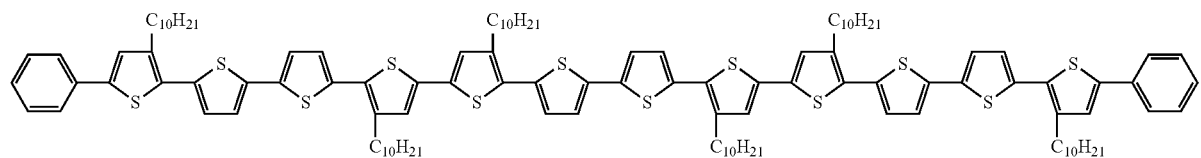
(19)
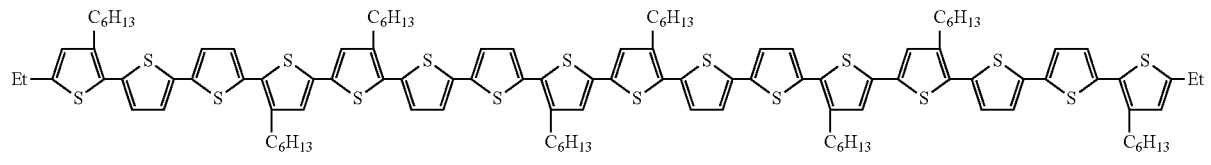
(20)
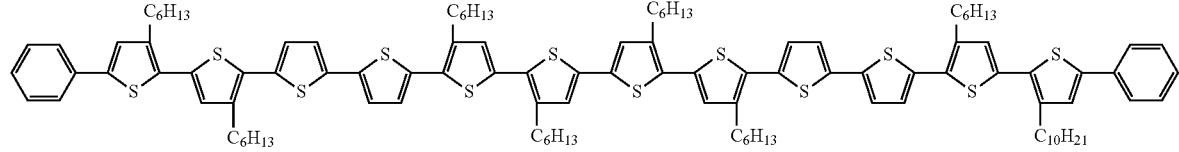
(21)
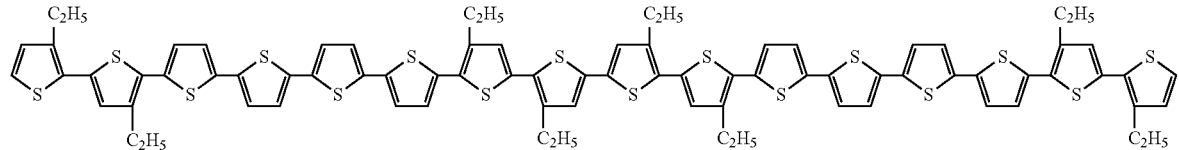
(22)

The synthetic methods of these thiophene oligomer are described in JP-A No. 2004-172317 (filed on Jun. 10, 2004) applied by the inventors of the present invention.

<Organic Film Transistor, Field Effect Transistor, and Switching Element>

The organic film transistor of the present invention, field effect transistor, and switching element using them will be explained below. Here, the switching element, depending on the use form thereof, may be referred to as an organic TFT element and may be called a field effect transistor element.

The organic TFT material of the present invention is used as a channel layer of the organic TFT and field effect transistor, thus a switching element (may be referred to as a transistor device) for driving satisfactorily can be provided. The organic TFT (organic film transistor) is broadly divided into a top gate type having a source electrode and a drain electrode connected by an organic semiconductor channel as a channel on a supporter and having a gate electrode on them via a gate insulating layer and a bottom gate type firstly having a gate electrode on a supporter and having a source electrode and a drain electrode connected by an organic semiconductor channel via a gate insulating layer.

When installing the thiophene oligomer relating to the present invention in a channel (may be referred to as a channel layer) of a switching element using an organic TFT or a field effect transistor, it can be installed on a substrate by vacuum evaporation, though it is preferable to install a solution adjusted by dissolving in an appropriate solvent medium and adding an additive when necessary on a substrate by cast coating, spin coating, printing, the ink jet method, or the ablation method.

In this case, a solvent medium for dissolving the organic semiconductor material of the present invention, if it dissolves the organic semiconductor material and a solution of an appropriate concentration can be prepared, is not restricted specifically. However, for example, in the case of the thiophene oligomer aforementioned, concretely, a chain ether-series solvent such as diethyl ether or di-isopropylether, a cyclic ether-series solvent such as tetrahydrofuran or dioxane, a ketone-series solvent such as acetone or methyl ethyl ketone, a halogenated alkyl-series solvent such as chloroform or 1,2-dichloroethane, an aromatic-series solvent such as toluene, o-dichlobenzene, nitrobenzene, or m-cresol, N-methylpyrrolidone, or carbon bisulfide may be cited.

For the organic semiconductor layer formed by coating, the aforementioned heat treatment is executed, thus the property of the organic film transistor can be improved as mentioned above, though the heat treatment for the organic semiconductor layer is preferably executed after the source electrode or drain electrode is formed. When the gate voltage is turned on or off, a current by a carrier flows through the organic semiconductor channel formed between the source electrode and the drain electrode, so that the structuration arrangement of the electrodes themselves on the interface where the source electrode and drain electrode respectively make contact with the organic semiconductor channel and that of the organic semiconductor material are important and the heat treatment aforementioned is preferably executed after the source electrode and drain electrode are formed.

According to the present invention, the materials for forming the source electrode, drain electrode, and gate electrode, if they are conductive materials, are not restricted specifically and various metallic materials can be used. For example, platinum, gold, silver, nickel, chromium, copper, iron, tin, antimony, lead, tantalum, indium, palladium, tellurium, rhenium, iridium, aluminum, ruthenium, germanium, molybdenum, tungsten, tin-antimony oxide, indium-tin oxide (ITO), fluorine doped zinc oxide, zinc, carbon, graphite, glassy carbon, silver paste, carbon paste, lithium, beryllium, sodium, magnesium, potassium, calcium, scandium, titanium, manganese, zirconium, gallium, niobium, alloy of sodium and potassium, mixture of magnesium and copper, mixture of magnesium and silver, mixture of magnesium and aluminum, mixture of magnesium and indium, mixture of aluminum and aluminum oxide, and mixture of lithium and aluminum are used, though specifically, platinum, gold, silver, copper, aluminum, indium, ITO, and carbon are preferable.

As an electrode forming method, a method for forming an electrode from a conductive film formed from one of the raw materials listed above by vacuum evaporation or sputtering by the well-known photolithographic method or lift-off method and a method for etching a metallic foil such as aluminum or copper using a resist by heat transfer or ink jet may be cited.

Further, as an electrode forming method, a method for patterning a conductive fine-particle dispersed liquid or a conductive polymer solution or dispersed liquid directly by the ink jet method and a method for forming an electrode from a coated film by lithography or laser ablation may also be cited. Furthermore, a method for patterning ink containing a conductive polymer or conductive fine particles or conductive paste by the printing method such as letterpress printing, intaglio printing, litho printing, or screen printing can be used.

Or, well-known polymers the conductivity of which is improved by doping, for example, conductive polyaniline, conductive polypyrrole, conductive polythiophene, and complex of polyethylene dioxythiophene and polystyrene sulfonic acid are used preferably. Among them, the conductive polymers having a low electric resistance on the contact surface with the semiconductor layer are preferable.

As a metallic material (metallic fine particles) of conductive fine particles, platinum, gold, silver, cobalt, nickel, chromium, copper, iron, tin, antimony, lead, tantalum, indium, palladium, tellurium, rhenium, iridium, aluminum, ruthenium, germanium, molybdenum, tungsten, and zinc can be used, though specifically, platinum, gold, silver, copper, cobalt, chromium, iridium, nickel, palladium, molybdenum, and tungsten which have a work function of 4.5 eV or more are preferable.

As a method for manufacturing such metallic fine-particle dispersions, the physical generation methods such as the in-gas evaporation method, sputtering method, and metallic vapor synthetic method and the chemical generation methods for reducing metallic ions in the liquid phase and generating metallic fine particles such as the colloid method and the co-precipitation method may be cited. However, metallic fine-particle dispersions manufactured by the colloid method described in Japanese Patent Applications 11-76800, 11-80647, and 11-319538 and Japanese Patent Application 2000-239853 and the in-gas evaporation method described in Japanese Patent Applications 2001-254185, 2001-53028, 2001-35255, 2000-124157, and 2000-123634 are preferable.

The average particle diameter of dispersed metallic fine particles is preferably 20 nm or smaller.

Further, the metallic fine-particle dispersions preferably contain a conductive polymer and when it is patterned, pressed, and heated, thus a source electrode and a drain electrode are formed, the electrodes can make ohmic contact with the organic semiconductor layer by the conductive polymer. Namely, the surfaces of the metallic fine particles are surrounded by the conductive polymer, thus the contact resistance with the semiconductor is lowered, and the metallic fine particles are heated and fused, so that the effect of the present invention can be heightened.

As a conductive polymer, a well-known conductive polymer the conductivity of which is improved by doping is used preferably and for example, conductive polyaniline, conductive polypyrrole, conductive polythiophene, and complex of polyethylene dioxythiophene and polystyrene sulfonic acid are used preferably.

The content of metallic fine particles is preferably 0.00001 to 0.1 as a mass ratio. When the mass ratio exceeds the upper limit, the fusion of the metallic fine particles may be obstructed.

When forming electrodes with these metallic fine-particle dispersions, after the source electrode and drain electrode are formed, the metallic fine particles are preferably fused by heating. Further, when forming electrodes, it is possible to apply a pressure of almost 1 to 50000 Pa and then almost 1000 to 10000 Pa to the metallic fine particles to promote fusion.

As a method for patterning the aforementioned metallic fine-particle dispersions as an electrode, when patterning directly by the ink jet method, as an ejecting method of the ink jet head, the well-known methods such as a continuously jetting type ink jet method of an on-demand type and an electrostatic suction type such as a piezo method and a Bubble Jet (registered trademark) method can be used.

As a heating and pressurizing method, not only the method used for a heating laminator but also the well-known methods can be used.

It is one of the preferable aspects to execute the heat treatment for the organic semiconductor material layer relating to the present invention after formation of the source and drain electrodes. By doing this, it may be considered that arrangement of molecules by the π stacks of the layer containing the organic semiconductor material relating to the present invention and the interface structure suitable for carrier movement on the interface between the layer containing the organic semiconductor material and the source electrode or the drain electrode are formed.

The film thickness of the organic semiconductor layer formed in this way is not restricted specifically, though the obtained TFT property often depends greatly on the film thickness of the semiconductor layer, and the film thickness, although varying with the semiconductor material, is generally 1 μm or less and specifically preferably 10 to 300 nm.

According to the present invention, it is possible to allow the organic semiconductor layer to contain, for example, a material used as a donor of electrons such as a material having a functional group such as acrylic acid, acetoamide, dimethylamino group, cyano group, carboxyl group, or nitro group, or a material as an acceptor for accepting electrons such as benzoquinone derivative, tetracyanoethylene, derivative thereof, tetracyanoquinodimethane, or derivative thereof, or a material having a functional group such as amino group, triphenyl group, alkyl group, hydroxide group, alkoxy group, or phenyl group, or substituted amine group such as phenylenediamine, or anthracene, benzoanthracene, substituted benzoanthracene group, pyrene, substituted pyrene, carbazole, derivative thereof, tetrathiafulvalene, or derivative thereof, thereby to perform the so-called doping process for it.

The doping aforementioned means introducing an electron accepting molecule (acceptor) or an electron donating molecule (donor) into the concerned film as a dopant. Therefore, the doped film is a film containing the aforementioned fused polycycle aromatic compound and dopant. The dopant used in the present invention can be used as an acceptor and a donor and a well-known material and process can be used.

As a gate insulating layer, various insulating films can be used, though specifically an inorganic oxide film having a high relative dielectric constant is preferable. As an inorganic oxide, silicon oxide, aluminum oxide, tantalum oxide, titanium oxide, tin oxide, vanadium oxide, barium/strontium titanate, barium zirconate titanate, lead zirconium titanate, lead lanthanium titanate, strontium titanate, barium titanate, barium/magnesium fluoride, bismuth titanate, strontium/bismuth titanate, strontium/bismuth tantalate, bismuth tantalate niobate, and trioxide yttrium may be cited. Among them, silicon oxide, aluminum oxide, tantalum oxide, and titanium oxide are preferable. Inorganic nitrides such as silicon nitride and aluminum nitride can be used preferably.

As a film forming method, the drive processes such as the vacuum deposition method, molecular beam epitaxial growth method, ion cluster beam method, low energy ion beam method, ion plating method, CVD method, sputtering method, and atmospheric pressure plasma method, the coating methods such as the spray coating method, spin coating method, blade coating method, dip coating method, casting method, roll coating method, bar coating method, and die coating method, and the wet processes such as the patterning methods of printing and ink jet may be cited and these methods can be used depending on the material.

As a wet process, a method for coating and drying a liquid obtained by dispersing fine particles of inorganic oxide in an optional organic solvent medium or water using a dispersing agent such as a surface active agent whenever necessary and the so-called sol-gel method for coating and drying an oxide precursor, for example, an alcoxide solvent are used. Among them, the atmospheric pressure plasma method and sol-gel method are preferable.

The insulating film forming method by the plasma film forming process under the atmospheric pressure is a process of discharging under the atmospheric pressure or pressure close to the atmospheric pressure, plasma-exciting reactive gas, and forming a film on a substrate and the method is described in Japanese Patent Applications 11-61406 and 11-133205 and Japanese Patent Applications 2000-121804, 2000-147209, and 2000-185362 (hereinafter, it may be referred to as also the atmospheric pressure plasma method). By this method, a highly functional film can be formed with high productivity.

Further, as an organic compound film, polyimide, polyamide, polyester, polyacrylate, photo-setting resin of photoradical polymerization system or photocationic polymerization system, copolymerizate containing acrylonitrile component, polyvinyl phenol, polyvinyl alcohol, novolak resin, and cyanoethyl pullulan can be used. As an organic compound film forming method, the aforementioned wet process is preferable. An inorganic oxide film and an organic compound film can be laminated and used together with each other. Further, the film thickness of the insulating films is generally 50 nm to 3 μm and preferably 100 nm to 1 μm.

Further, the supporter is composed of glass or a flexible plastic sheet and for example, a plastic film can be used as a sheet. As a plastic film, for example, films composed of polyethylene terephthalate (PET), polyethylene naphthalate (PEN), poyether sulfon (PES), polyether imide, polyether ether ketone, polyphenylene sulfide, polyarylate, polyimide, polycarbonate (PC), cellulose triacetate (TAC), or cellulose acetate propionate (CAP) may be cited. By use of a plastic film like this, compared with a case using a glass substrate, lightweight can be realized, and the portability can be enhanced, and the shock resistance can be improved.

FIGS. 2(a) to 2(f) show configuration examples of the organic film transistor relating to the present invention.

Figure 2A:
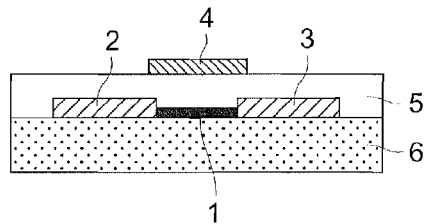
FIGS. 2(a) to 2(f) are drawings showing constitution examples of the organic TFT relating to the present invention.
Figure 2D:
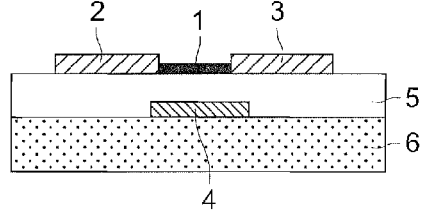
Figure 2B:
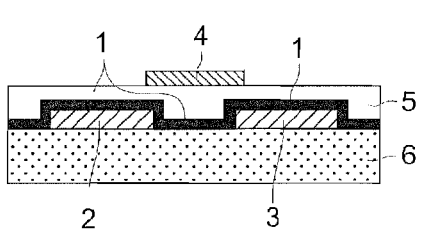

In FIG. 2(b), on a glass supporter 6, a pattern is formed by depositing gold or others using a mask, or a pattern is formed by the sputtering film forming method and photolithographic method, or a pattern of a layer including metallic fine particles is formed, and then the layer including the metallic fine particles may be heated, pressurized, and fused, though a source electrode 2 and a drain electrode 3 are formed by an optional method, and an organic semiconductor material layer 1 is formed on them, and at a temperature higher than the exothermic point and lower than the endothermic point of the used organic semiconductor material obtained by the DSC measurement, it is heated and pressurized for a given period of time, and the semiconductor layer 1 is formed, and a gate insulating layer 5 is formed on it, and furthermore, a gate electrode 4 is formed on it, thus an organic TFT is formed.

Figure 2E:
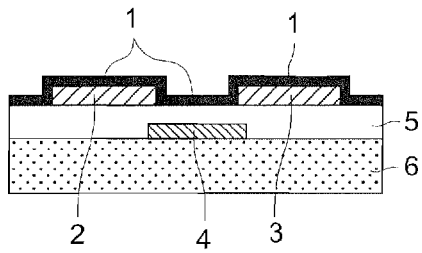
Figure 2C:
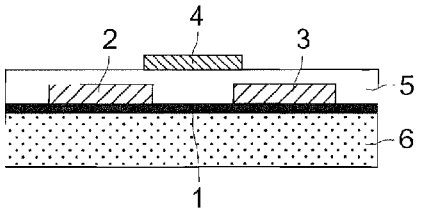

FIGS. 2(a) and 2(c) show other configuration examples of the organic film transistor of the top gate type.

Figure 2F:
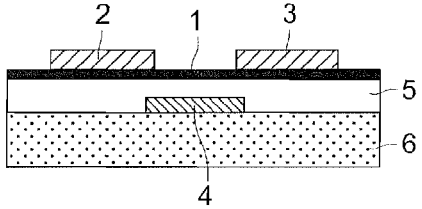

Further, FIG. 2(f) shows an example that the gate electrode 4 is formed on the supporter 6, and then the gate insulating layer 5 is formed, and the organic semiconductor material layer 1 is formed on it, and the source electrode 2 and drain electrode 3 are formed by a method using the aforementioned deposition and metallic fine particles, and an organic TFT of the bottom gate type is formed. Similarly, other configuration examples are shown in FIGS. 2(d) and 2(e).

Figure 3:
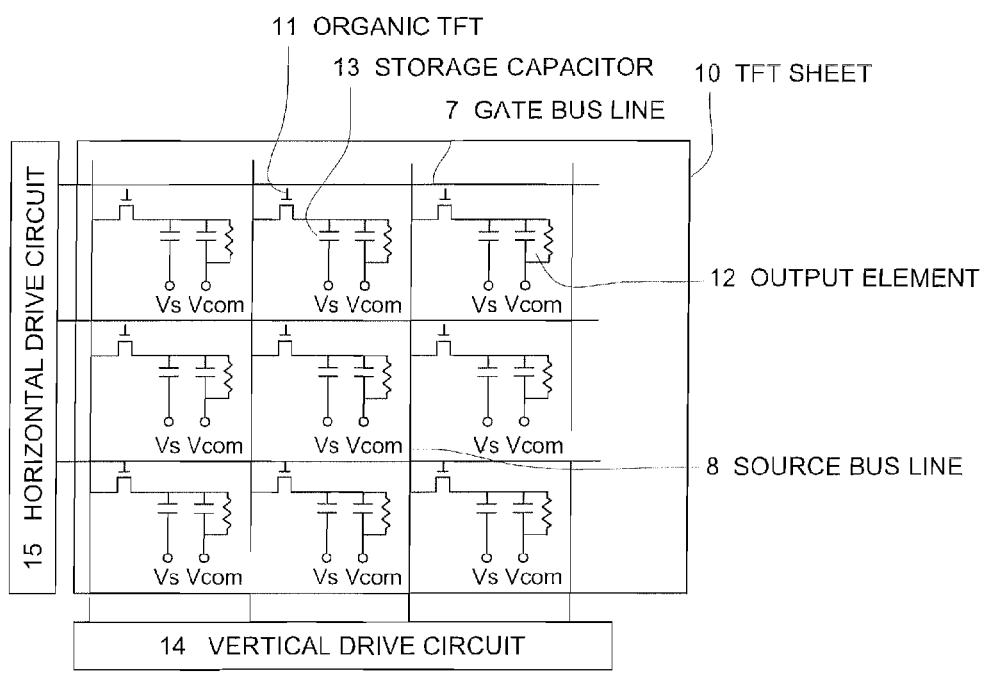
FIG. 3 is an example of a schematic equivalent circuit diagram of the organic TFT of the present invention.

FIG. 3 shows an example of a schematic equivalent circuit diagram of the TFT sheet.

A TFT sheet 10 has many organic TFTs 11 arranged in the matrix shape. Numeral 7 indicates a gate bus line of each organic TFT 11 and 8 indicates a source bus line of each organic TFT 11. To the source electrode of each organic TFT 11, an output element 12 is connected and it is, for example, a liquid crystal or an electrophoresis element and constitutes pixels on a display unit. A pixel electrode may be used as an input electrode of a photosensor. In the example shown in the drawing, the output element is composed of a liquid crystal and the equivalent circuit is composed of a resistor and a capacitor. Numeral 13 indicates a storage capacitor, 14 a vertical drive circuit, and 15 a horizontal drive circuit.

EXAMPLES

Hereinafter, the present invention will be explained concretely by referring to the examples, however, the present invention is not limited thereto.

Example 1

A thermally grown oxide layer with a thickness of 200 nm is formed on an n-type Si wafer of resistivity of 0.02 Ω·cm, is immersed in an octadecyl trichlorosilane toluene solution (2 wt %) for 10 minutes, then is rinsed in toluene, and is dried, thus the thermally grown oxide layer is surface-treated, and a gate insulating film is formed.

Next, the organic semiconductor layer is formed using the compound example <1> as a semiconductor material. A result of DSC measurement of the semiconductor material is shown in FIG. 1, which shows exothermic heat at a peak of 41.9° C. and endothermic heat at a peak of 85.1° C. From the aforementioned standard, the exothermic point is at 31.9° C. and the endothermic point is at 79.6° C.

A chloroform solution of the semiconductor material compound example <1> is prepared and is bubbled by nitrogen gas, thus the dissolved oxygen in the solution is removed, and the solution is coated on the surface of the thermally grown oxide layer (silicone oxide film) in a nitrogen gas atmosphere of $1.013 \times 10^2$ kPa using an applicator. It is dried at room temperature and then is heat-treated in the nitrogen gas atmosphere at 50° C. for 30 minutes. The film thickness of the semiconductor layer at this time is 20 nm.

Furthermore, the surface of the film is deposited with gold using a mask, thus a source electrode and a drain electrode are formed.

In this way, an organic film transistor with a channel length L of 30 μm and a channel width W of 1 mm is prepared. This transistor operates satisfactorily as a p-channel enhancement mode TFT. The carrier mobility of the prepared organic film transistor obtained from the saturation region of the I-V property is 0.08 $cm^2/V \cdot s$.

Comparative Example 1

Except that the heat treatment after drying is not executed in Example 1, an organic film transistor is prepared similarly. The mobility measured similarly is 0.0006 $cm^2/V \cdot s$.

Example 2

Example 1, the semiconductor material is changed to the compound example <9> and an organic film transistor is prepared similarly. However, in the heat treatment, the thermally grown oxide layer is dried at room temperature and then is heat treated at 93° C. for 30 minutes in a nitrogen gas atmosphere of $1.013 \times 10^2$ kPa. Further, in the semiconductor material of the compound example <9>, it is observed that the exothermic peak is at 70.2° C. and the endothermic peak is at 106.6° C. and the aforementioned exothermic point is at 59.2° C. and the aforementioned endothermic point is at 102.7° C. (the differential scanning thermal analyzer (DSC) used is DSC6220 produced by SSI Nano-Technology, Ltd.). The prepared transistor operates satisfactorily as a p-channel enhancement mode TFT similarly to Example 1 and the mobility in the saturation region is 0.15 $cm^2/V \cdot s$.

Comparative Example 2

Except that the heat treatment after drying is not executed in Example 2, an organic film transistor is prepared similarly. The measured mobility of the saturation region of the prepared transistor is 0.002 $cm^2/V \cdot s$.

Example 3

The thionphene polymer described in J. Am. Chem. Soc. 2004, 126, 3378-3379 is synthesized and is used as a semiconductor material, and similarly to Example 1, a film transistor is prepared. Further, the exothermic point and endothermic point of the composed polymer similarly measured using the aforementioned analyzer are respectively 70° C. and 126° C.

A chloroform solution is prepared and is bubbled by nitrogen gas, thus the dissolved oxygen in the solution is removed, and the solution is coated on the surface of a gate insulating film subject to the aforementioned surface treatment in a nitrogen gas atmosphere using an applicator. It is dried at room temperature and then is heat-treated in a nitrogen gas atmosphere of $1.013 \times 10^2$ kPa at 80° C. for 30 minutes. The film thickness of the semiconductor layer at this time is 20 nm.

Furthermore, similarly to Example 1, the surface of the film is deposited with gold using a mask, thus a source electrode and a drain electrode are formed, and an organic film transistor with a channel length L of 30 μm and a channel width W of 1 mm is prepared. This transistor operates satisfactorily as a p-channel enhancement mode TFT and the mobility of the saturation region is 0.02 cm$^2$/V·s.

Comparative Example 3

Similarly to Example 3, an organic film transistor is prepared free of the heat treatment. The measured mobility of the saturation region of the prepared transistor is 0.008 cm$^2$/V·s.

As mentioned above, it is found in the organic film transistor that, by the heat treatment for the organic semiconductor layer of the present invention, the carrier mobility is improved greatly.

INDUSTRIAL APPLICABILITY

The present invention can provide a manufacturing method of an organic film transistor having an excellent semiconductor performance in which although an organic semiconductor layer formed by coating is used, the carrier mobility of the organic semiconductor layer is high, and the current in the switching-on state is low, and the current ON/OFF value is satisfactory.

What is claimed is:

1. A method of producing an organic thin film transistor comprising sequential steps of forming the following elements on a substrate:
   forming a gate electrode;
   forming a gate insulating layer;
   forming an organic semiconductor layer;
   forming a source electrode; and
   forming a drain electrode,
   wherein
      the organic semiconductor layer comprises an organic semiconductor material exhibiting an exothermic point and an endothermic point in differential scanning calorimetry; and
      the organic semiconductor layer is subjected to a heat treatment carried out at a temperature not less than the exothermic point and less than the endothermic point, after the organic semiconductor layer is formed.

2. The method of claim 1, wherein the organic semiconductor layer is formed by using a solution or a dispersion liquid comprising an organic semiconductor material.

3. The method of claim 1, wherein the organic semiconductor material is a π-conjugated compound.

4. The method of claim 1, wherein a weight average molecular weight of the organic semiconductor material is 5000 or less.

5. The method of claim 1, wherein the organic semiconductor layer is subjected to a heat treatment after the source electrode or the drain electrode is formed.

* * * * *